United States Patent [19]

Young

[11] Patent Number: 5,051,949

[45] Date of Patent: Sep. 24, 1991

[54] CONTENT ADDRESSABLE MEMORY DEVICE

[75] Inventor: William R. Young, Palm Bay, Fla.

[73] Assignee: Harris Corporation, Melbourne, Fla.

[21] Appl. No.: 437,472

[22] Filed: Nov. 15, 1989

[51] Int. Cl.$^5$ ............................................. G11C 15/04
[52] U.S. Cl. ...................................... 365/49; 365/156; 365/190
[58] Field of Search ............ 365/49, 154, 190, 189.01, 365/156

[56] References Cited

U.S. PATENT DOCUMENTS 4,833,643  5/1989  Hori ..................................... 365/49

Primary Examiner—Joseph A. Popek
Attorney, Agent, or Firm—Evenson, Wands, Edwards, Lenahan & McKeown

[57] ABSTRACT

A memory device for a content addressable memory is configured of a pair of multibit memory cells which permits the memory to be programmably readable on an individual bit basis, whereby the memory may be selectively programmed to be fully content addressable, partially content addressable, or non-content addressable. The memory device is coupled to a complementary bit line pair and has a pair of word enable lines coupled to address lines and a respective row output line, the state of which is monitored during an associative read operation. Data is stored in a respective memory device in the form of complementary bit codes, individual components of which are written into the memory cells. The participation of each memory device during an associative read operation is controlled by means of a set of switching circuits that are coupled to each memory cell, the bit lines and the output line. Depending upon the multibit codes that have been stored in the memory cells and the contents of the bit lines, these controlled switching circuits controllably cause a prescribed logic potential to be applied by the memory device to the output line and thereby indicate the occurrence of a match.

40 Claims, 2 Drawing Sheets

| DATA | STORE | MEMORY CELL #10 | | MEMORY CELL #20 | |
|---|---|---|---|---|---|
| 1 | | 0 | 1 | 0 | 1 |
| 0 | | 1 | 0 | 1 | 0 |
| DON'T CARE | | 1 | 0 | 0 | 1 |
| INHIBIT | | 0 | 1 | 1 | 0 |

CONTENT ADDRESSABLE MEMORY DEVICE

FIELD OF THE INVENTION

The present invention relates in general to digital signal processing systems and is particularly directed to a content addressable memory device that may be selectively programmed to be fully content addressable, partially content addressable, or non-content addressable.

BACKGROUND OF THE INVENTION

A content addressable or associative memory is a data storage facility that permits a data processing system to rapidly determine whether a particular piece of information is stored in that facility by performing a simultaneous examination of the entire contents of the memory, rather than by successively scanning through all the addresses and examining the contents of each addressed location on an individual basis. Because each memory device within a conventional content addressable memory contains only one storage entry per bit line, which memory devices are to affect the results of an associative read operation cannot be individually controlled. Instead, selective participation or masking must be carried out by way of a sequential scan of the memory addresses, which essentially defeats the basic purpose (effectively simultaneous reading of the contents of all memory devices) of the memory.

SUMMARY OF THE INVENTION

In accordance with the present invention there is provided a new and improved content addressable memory, the configuration of each memory device permits the memory to be programmably readable on an individual bit basis, so that the memory may be selectively programmed to be fully content addressable, partially content addressable, or non-content addressable. Pursuant to the present invention, rather than allocate only one storage entry per bit line, each memory device contains a pair of bit cells, so that more information may be stored in each device. This additional storage space provides each memory device with the ability to be individually programmed with respect to its participation in an associative read operation.

More specifically, the content addressable memory according to the present invention is comprised of a matrix of N columns of complementary bit line pairs and M rows of address line pairs, distributed among which is an array of NXM memory devices coupled to respective ones of the N columns of complementary bit line pairs and respective ones of the M rows of address line pairs. Within the array, each memory device is coupled to first and second complementary bit lines of an individual bit line pair, by way of which complementary bit values are applied from a column of complementary bit line pairs to the memory device. Each memory device also has first and second word enable lines coupled to a respective row of the address line pairs, and a respective row output line, the state of which is monitored during the course of an associative read operation.

Data is stored in a respective memory device in the form of complementary bit codes, individual components of which are written into first and second multibit memory cells. The first multibit memory cell is coupled to the first word enable line and the second memory cell is coupled to the second word enable line of the address line pair. In addition, each cell is coupled to each of the first and second complementary bit lines, so that it may store complementary bits that have been placed on the first and second complementary bit lines, during the programming of the memory, in accordance with first and second word enable signals respectively applied to the first and second word enable lines.

The participation of each memory device in the course of an associative read operation is controlled by means of a set of switching circuits that are coupled to each memory cell, the first and second complementary bit lines and the output line. Depending upon the multibit codes that have been stored in the memory cells and the contents of the bit lines, these controlled switching circuits controllably cause one of a pair of potentials to be applied by the memory device to the output line. If there is a mismatch between the contents of the memory device and the bit lines, or if the multibit code stored in the cell identifies that memory device as being excluded from the associative read process, then the applied potential causes the logical state of the row output line to be inverted. On the other hand, if there is a match between the contents of the memory device and the bit lines, or if the multibit code stored in the cell identifies that memory device as being a 'don't care' in the associative read process, then the applied potential causes the logical state of the row output line to be unaffected.

In accordance with a preferred embodiment of the invention, each multibit memory cell comprises a pair of one bit storage elements for storing respective complementary bit values. For each cell respective sets of word enable transistors are coupled to one of the first and second word enable lines, to each of the first and second complementary bit lines and to the pair of storage elements, for controllably enabling the storage of complementary bit values that have been placed on the two complementary bit lines in the pair of storage elements. The set of switching circuits includes a first pair of series-connected transistors, coupled between a first prescribed potential terminal and the output line. One of the series-connected transistors has its control (gate) input coupled to one of the complementary bit lines and the other transistor has its control (gate) input coupled to one of the storage elements of the cell. When both transistors of the series-connected pair are enabled (in accordance with the bit value of the one bit line and the bit value stored in the one storage element), the first prescribed potential is coupled to output line, so that its logical state is inverted. Otherwise, the first potential terminal is decoupled from the output line, so that the logical state of the output line remains unaffected by the associative read operation, indicating either a match or a 'don't care' for that memory device.

Programming of an individual memory device to control its mode of operation is effected by writing prescribed complementary bit code pairs in the memory cells of that device. In particular, for a first data value (e.g. "1") to be stored in the memory device, a first set of complementary bit values (e.g. "0 1") is written into in each of the multibit memory cells of the memory device for that memory array location. On the other hand for the opposite data value (e.g. "0") to be stored in the memory device, a second, complementary set of bit values (e.g. "1 0") is written into each memory cell. The memory device is interrogated by coupling one of the first and second sets of complementary bit values to the complementary bit lines and monitoring the state of said output line. A match causes no change in the logical state of the output line, while a mismatch inverts its logical state.

For a 'don't care' state of the memory device, one of the first and second sets of complementary bit values (e.g. "1 0") is written into one memory cell and the other of the complement of that set (e.g. "0 1") is written into the other memory cell, so that, regardless of the interrogation of the memory device, neither of the series-connected pairs of switching transistors couples the first potential to the output line, so that its logical state remains unaffected, as in the case of a match.

For an 'inhibit' state of said memory device, writing the other complementary bit value set (e.g."0 1") into the one memory cell and the one complementary bit value set (e.g. "1 0") into the other memory cell will cause one of the series-connected transistor pairs to provide a transmission path between the first potential and the output line upon interrogation of the memory device, regardless of the states of the bit lines. As a result, the logical state of the output line becomes inverted, indicating no match.

Because each memory cell is individually programmable, a further aspect of the present invention is its ability to function as a conventional random access memory, having a 2M×N storage capacity.

DETAILED DESCRIPTION

Figures 1, 2:
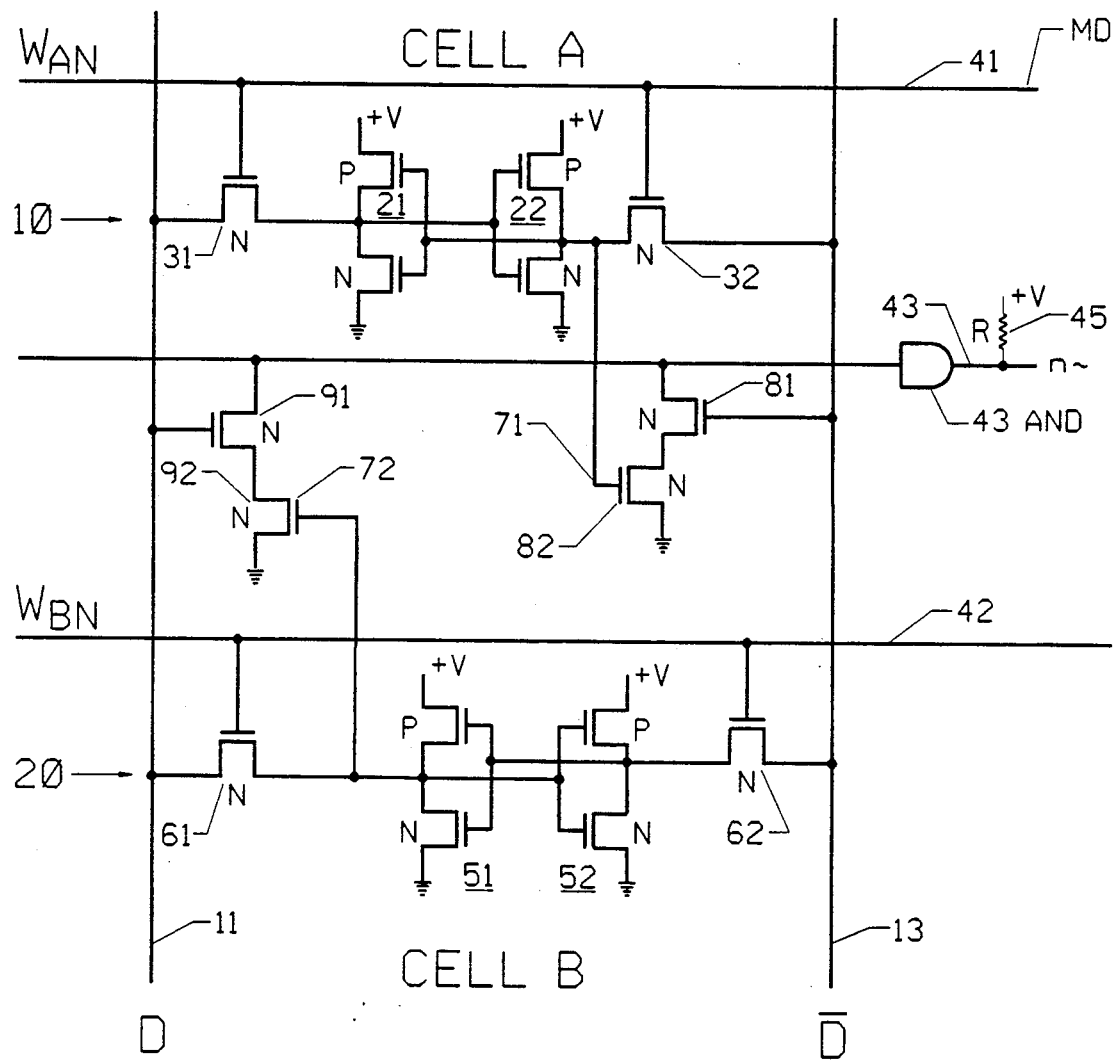
FIG. 1 shows the circuitry configuration of an embodiment of a content addressable memory device in accordance with the present invention.
FIG. 2 shows a table for programming an individual memory device to control its mode of operation.

Referring to FIG. 1, the circuitry configuration of an embodiment of a content addressable memory device MD in accordance with the present invention is diagrammatically illustrated as comprising a pair of memory cells 10 and 20 that are coupled to a pair of complementary data lines 11 and 13, to which the complementary states D, D' of an individual data value D are respectively applied, for both writing data into the memory device and conducting an associative read operation. In the description to follow, for purposes of providing a non-limitative example, a logical high, or "1", is represented by a positive voltage +V and a logical low, or "0", is represented by ground (GND) potential. As shown in FIG. 1, memory cell 10 is formed of a pair of cross-coupled complementary MOSFET inverters 21 and 22 the source-drain paths of which are coupled between respective high (+V) and low (GND) potentials. The output of inverter 21 and the input to inverter 22 are accessed through the source-drain path of a first word-enable N-channel field effect transistor 31, which is coupled between bit line 11 and the output of inverter 21 and the input to inverter 22. The gate of transistor 31 is coupled to a first word enable line 41. When enabled by a high logic level on word enable line 41, word-enable transistor 31 is gated ON and couples the data on bit line D to the input inverter 22. Similarly, the output of inverter 22 and the input of inverter 21 is accessed through the source-drain path of a second word-enable N-channel field effect transistor 32, which is coupled between inverted bit line 13 and the output of inverter 22 and the input of inverter 21. The gate of transistor 32 is also coupled to word enable line 41, so that word-enable transistor 32 is also gated ON by a high logic level on word enable line 41, and thereby controllably couples the data on inverted bit line D' to the input to inverter 21.

Likewise, memory cell 20 is formed of a pair of cross-coupled complementary MOSFET inverters 51 and 52, the source-drain paths of which are coupled between respective high (+V) and low (GND) potentials. The output of inverter 51 and the input to inverter 52 are accessed through the source-drain path of a third word-enable N-channel field effect transistor 61, which is coupled between bit line 11 and the output of inverter 51 and the input of inverter 52. The gate of transistor 61 is coupled to a second word enable line 42. When enabled by a high logic level on word enable line 42, word-enable transistor 61 is gated ON and couples the data on bit line D to the input of inverter 52. Similarly, the output of inverter 52 and the input to inverter 51 is accessed through the source-drain path of a fourth word-enable N-channel field effect transistor 62, which is coupled between inverted bit line 13 and the output of inverter 52 and the input of inverter 51. The gate of transistor 62 is also coupled to word enable line 42, so that transistor 62 is gated ON by a high logic level on word enable line 42 and thereby controllably couples the data on inverted bit line D' to the input of inverter 51.

Figure 3:
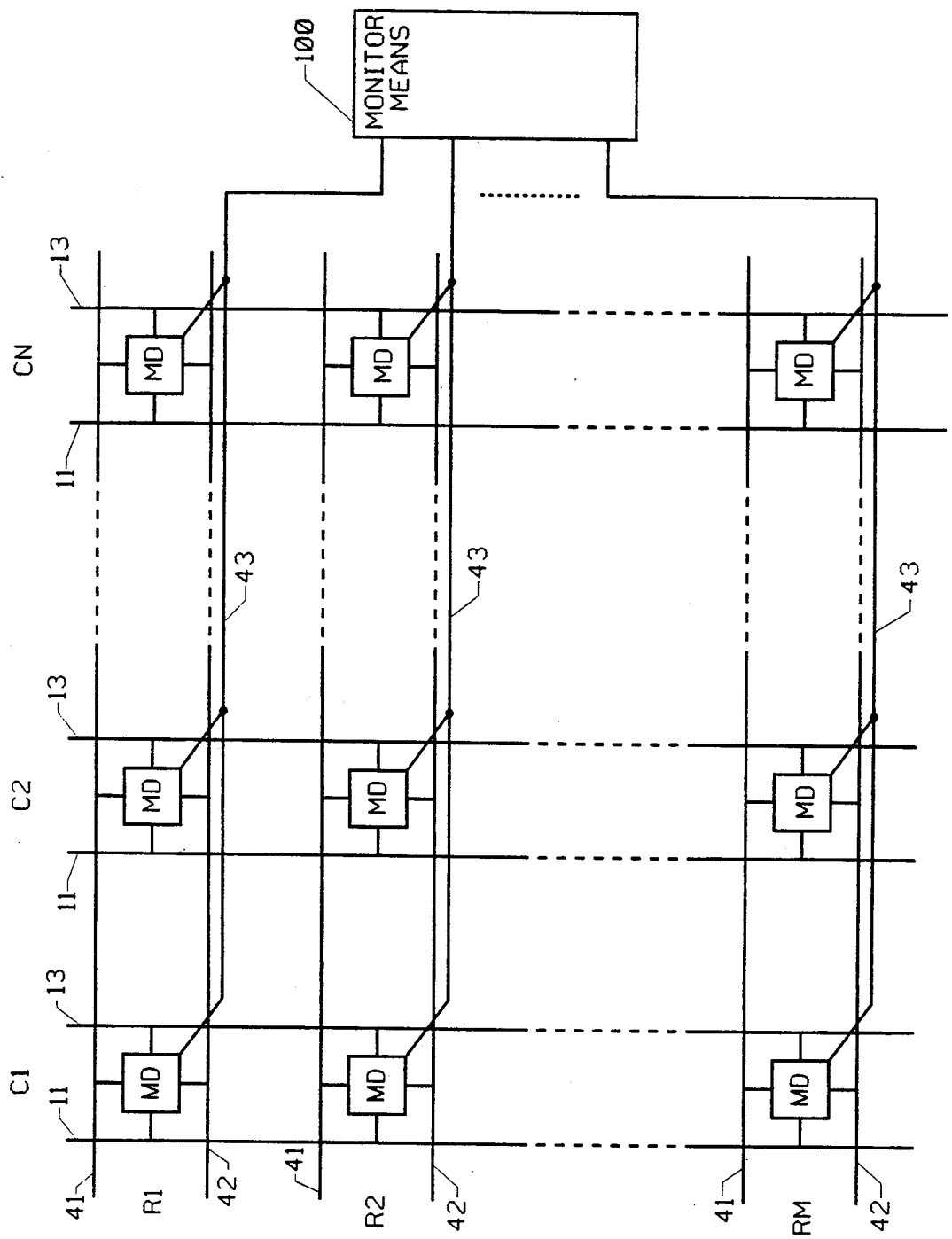
FIG. 3 diagrammatically shows an N×M memory cell matrix coupled with an output line monitoring means.

Memory cells 10 and 20 are coupled to respective switching circuits 71 and 72, through each of which a logical state inverting potential is controllably applied to an output line 43 of the row of an N column by M row matrix of memory cells, in which the memory device resides in the course of an associative read operation. Such a matrix is diagrammatically shown in FIG. 3 as being comprised of N columns C1-CN and M rows R1-RM of memory devices MD. The output lines 43 of each row are coupled to a monitoring means 100 which monitors the state of output lines 43. Output line 43 is coupled to each of memory cells 10 and 20 within a given $i^{th}$ row of the matrix. Via a suitable bias circuit, such as resistor 45 to +V potential, line 43 is normally high. It will remain high if, and only if, all bits of that (row) word match the respective bit contents of an associative read operation, or are 'don't care' bits. Namely, line 43 is effectively the logical "AND" of all bits within the word, as represented by the broken-lined AND gate 43 AND. Other bias circuit configurations may be used in place of resistor 45. For example, line 43 may be coupled to the drain of a grounded-gate PMOS transistor, the source of which is coupled to +V. Similarly, a precharged inverter may be used to bias line 43.

Switching circuit 71 includes a first pair of series-connected N-channel MOS field effect transistors 81 and 82, coupled between low potential (GND) and output line 43. A first, transistor 81, of the series-connected transistors 81, 82 has its control (gate) input coupled to complementary bit line 13 and the second transistor 82 has its control (gate) input coupled to the output of inverter 22 of cell 10. When both transistors 81, 82 are enabled (by a high (+V) voltage on complementary bit line 13) and a logical "1" bit value stored at the output of inverter 22, a low potential is coupled to output line 43, so that its logical state is inverted from its normally logical high (+V) state. Otherwise, if either transistor 81 or 82 is turned OFF, low potential is prevented from being coupled through this transistor pair to line 43, so that the logical state of output line 43 remains at a logical high, indicating either a match or a 'don't care' for that memory device.

Switching circuit 72, which is coupled between memory cell 20 and output line 43, includes a second pair of series-connected N-channel MOS field effect transistors 91 and 92, coupled between low potential (GND) and output line 43. A first transistor 91, of the series-connected transistors 91, 92 has its control (gate) input coupled to complementary bit line 11 and the second transistor 82 has its control (gate) input coupled to the output of inverter 51 of memory cell 20. When both transistors 91, 92 are enabled (by a high (+V) voltage on complementary bit line 11) and a logical "1" bit value stored at the output of inverter 51, a low potential is coupled to output line 43, so that its logical state is inverted from its normally logical high (+V) state. Otherwise, if either transistor 91 or 92 is turned OFF, low potential is prevented from being coupled through this transistor pair to line 43, so that the logical state of output line 43 remains at a logical high.

Programming of an individual memory device to control its mode of operation is effected by writing prescribed complementary bit code pairs in the memory cells of that device in accordance with the code pair listings of FIG. 2. More particularly, to store the data value "1" in the memory device, a first set of complementary bit values (e.g. "0 1") is written into inverter pairs 21, 22 and 51, 52 of multibit memory cells 10 and 20, respectively. For this purpose, a logical "0" level is placed on bit line 11, while its logical complement "1" is placed on complementary bit line 13. An enabling voltage is then applied to each of word-enable lines 41 and 42, so that each of memory cells stores the bit pair "0 1". To store the opposite data value "0", the complementary set of bit values "1 0" is written into each of memory cells 10 and 20.

The memory device is interrogated associatively by coupling one of these first and second sets of complementary bit values ("0 1") or ("1 0") to complementary bit lines 11 and 13 and monitoring the state of output line 43. As pointed out above, if the bit code stored in each of memory cells 10 and 20 matches the code on bit lines 11 and 13, transistor 81 within switching circuit 71 will be gated OFF by the "0" on bit line 13 and transistor 92 within switching circuit 72 will be gated OFF by the "0" stored at the output of inverter 51. As a consequence, the memory device causes no change in the logical state (high) of output line 43. Similarly, for a "0" stored in each of memory cells 10 and 20, corresponding to the code "1 0", the application of a "0" to bit line 11 and a "1" to bit line 13 will cause transistor 91 within switching circuit 72 to be gated OFF by the "0" on bit line 11, while transistor 82 within switching circuit 71 will be gated OFF by the "0" stored at the output of inverter 22. As a consequence, the memory device causes no change in the logical state (high) of output line 43.

On the other hand, if the contents of memory cell 10 does not match the contents of bit line 13, or if the contents of memory cell 20 does not match the contents of bit line 11 and bit line 11 and 13 are complementary, both transistors in one of switching circuits 71 and 72 will be gated ON, thereby causing the low potential to be coupled to output line 43, inverting its logical state and indicating a mismatch.

For a 'don't care' state of the memory device, the complementary bit pair "1 0" is written into memory cell 10 and the complementary bit pair "0 1" is written into memory cell 20. As a result, each of transistors 82 and 92 is gated OFF, so that, regardless of the interrogation of the memory device, neither of switching circuits 71 and 72 couples GND potential to output line 43. Thus, its logical state remains unaffected, as in the case of a match. This 'don't care' state may be selectively imparted to the same bit position of multiple words of the matrix by applying a '0' to each of bit lines 11 and 13. As a consequence, each of transistors 81 and 91 for each memory cell pair of that column will be gated OFF thereby preventing ground potential from being applied to output line 43 from that bit position. In effect, this removes that bit position from an associated read operation.

To prevent the memory device from participating in an associative read operation, namely to 'inhibit' the memory device, the complementary bit value set "0 1" is written into memory cell 10 and the complementary bit value set "1 0" is written into memory cell 20. As a result, conversely to the 'don't care' state of the memory device, each of transistors 82 and 92 is gated ON, so that, regardless of the interrogation of the memory device, one switching circuits 71 and 72 will see a logical high on its associated bit line and thereby couple GND potential to output line 43. As a result, the logical state of the output line becomes inverted, indicating no match.

As will be appreciated from the foregoing description, the present invention provides a content addressable memory device which permits the memory to be programmably readable on an individual bit basis, so that the memory may be selectively programmed to be fully content addressable, partially content addressable, or non-content addressable. By configuring each memory device to contain a pair of bit cells, each device has the ability to be individually programmed with respect to its participation in an associative read operation. Moreover, since each memory cell is individually programmable, a further aspect of the present invention is its ability to function as a conventional random access memory, having a 2M×N storage capacity. In this mode of operation the pairs of word enable lines are used for normal addressing purposes during write-in and read-out of the memory.

While I have shown and described an embodiment in accordance with the present invention, it is to be understood that the same is not limited thereto but is susceptible to numerous changes and modifications as known to a person skilled in the art, and I therefore do not wish to be limited to the details shown and described herein but intend to cover all such changes and modifications as are obvious to one of ordinary skill in the art.

What is claimed:

1. A content addressable memory device comprising: first and second complementary data lines;
 a first memory cell having first and second storage elements for storing respective data values therein, and first means, coupled to said complementary data lines and said first and second storage elements, for controllably enabling the storage of data values, that have been placed on said data lines, in said first and second storage elements;
 a second memory cell having third and fourth storage elements for storing respective data values therein, and second means, coupled to said complementary data lines and said third and fourth storage elements, for controllably enabling the storage of data values, that have been placed on said data lines, in said third and fourth storage elements;

an output line;

third means, coupled to said output line, one of said data lines and one of said first and second storage elements, for controllably coupling a prescribed potential to said output line in accordance with the contents of said one of said first and second storage elements and the data value of said one of said data lines: and fourth means, coupled to said output line, the other of said data lines and one of said third and fourth storage elements, for controllably coupling said prescribed potential to said output line in accordance with the contents of said one of said third and fourth storage elements and the data value of said other of said data lines.

2. A content addressable memory device according to claim 1, wherein said first means includes means for controllably coupling said first data line to said first storage element and said second data line to said second storage element, and wherein said third means is coupled to said second storage element and to said second data line.

3. A content addressable memory device according to claim 2, wherein said second means includes means for controllably coupling said first data line to said third storage element and said second data line to said fourth storage element, and wherein said fourth means is coupled to said third storage element and to said first data line.

4. A content addressable memory device according to claim 3, wherein said third means comprises first and second controllable switching elements coupled in series between said prescribed potential and said output line, said first switching element having a control input coupled to said second data line and said second switching element having a control input coupled to said second storage element.

5. A content addressable memory device according to claim 4, wherein said fourth means comprises third and fourth controllable switching elements coupled in series between said prescribed potential and said output line, said third switching element having a control input coupled to said first data line and said fourth switching element having a control input coupled to said third storage element.

6. A content addressable memory device according to claim 5, wherein said first and second means are respectively coupled to first and second word enable lines for said memory device.

7. A content addressable memory device according to claim 6, wherein the storage elements and the respective means of said memory device are comprised of MOS field effect transistors.

8. A method of controlling the operation of a content addressable memory device that is coupled to first and second complementary data lines by way of which data is written into said memory device and through which said memory device is interrogated, first and second word enable lines for selectively addressing said memory in the course of storage of data in said memory device, and an output line, said content addressable memory device comprising a first memory cell having first and second storage elements for storing respective data values therein, first means, coupled to said complementary data lines, said first word enable line and said first and second storage elements, for controllably enabling the storage of data values, that have been placed on said data lines, in said first and second storage elements, respectively, a second memory cell having third and fourth storage elements for storing respective data values therein, second means, coupled to said complementary data lines, said second word enable line and said third and fourth storage elements, for controllably enabling the storage of data values, that have been placed on said data lines, in said third and fourth storage elements, respectively, third means, coupled to said output line, one of said data lines and one of said first and second storage elements, for controllably coupling a prescribed potential to said output line in accordance with the contents of said one of said first and second storage elements and the data value of said one of said data lines, and fourth means, coupled to said output line, the other of said data lines and one of said third and fourth storage elements, for controllably coupling said prescribed potential to said output line in accordance with the contents of said one of said third and fourth storage elements and the data value of the other of said data lines, said method comprising the steps of:

(a) for a first data value to be stored in said memory device, writing a first set of complementary data values in each of said first and second memory cells;

(b) for a second data value to be stored in said memory device, writing a second set of complementary data values in each of said first and second memory cells; and (c) interrogating said memory device by coupling one of said first and second sets of complementary data values to said complementary data lines, and monitoring the state of said output line.

9. A method according to claim 8, further including the step of:

(d) for a 'don't care' state of said memory device, writing one of said first and second sets of complementary data values into said first memory cell and the other of said first and second sets of complementary data values into said second memory cell, whereby, regardless of the interrogation of said memory device in step (c), each of said third and fourth means decouples said prescribed potential from said output line.

10. A method according to claim 9, further including the step of:

(e) for an 'inhibit' state of said memory device, writing the other of said first and second sets of complementary data values into said first memory cell and said one of said first and second sets of complementary data values into said second memory cell, whereby, upon interrogation of said memory device in step (c), one of said third and fourth means couples said prescribed potential to said output line.

11. A method according to claim 8, further including the step of:

(d) for an 'inhibit' state of said memory device, writing one of said first and second sets of complementing data values into said first memory cell and the other of said first and second sets of complementary data values into said second memory cell, whereby, upon interrogation of said memory device in step (c), one of said third and fourth means couples said prescribed potential to said output line.

12. A content addressable memory device comprising:
   first and second complementary bit lines by way of which complementary bit values are applied to said memory device;
   first and second word enable lines;
   an output line;
   first and second multibit memory cells, respectively coupled to said first and second word enable lines and to each of said bit lines, for controllably storing complementary bits that have been placed on said bit lines in accordance with first and second word enable signals applied to said first and second word enable lines, respectively; and
   means, coupled to said first and second memory cells, to each of said bit lines and to said output line, for controllably coupling a prescribed potential to said output line in accordance with the contents of said first and second memory cells and the complementary bits applied to said bit lines.

13. A content addressable memory device according to claim 12, wherein said prescribed potential coupling includes means for preventing said prescribed potential from being coupled to said output line in response to the application of the same prescribed bit value to each of said bit lines, irrespective of the contents of said first and second memory cells.

14. A content addressable memory device according to claim 12, wherein said prescribed potential coupling includes means for preventing said prescribed potential from being coupled to said output line in response to the each of said first and second memory cells having stored therein a complementary bit pattern that is opposite to the complementary bit pattern applied to said bit lines.

15. A content addressable memory device according to claim 14, wherein said prescribed potential coupling means includes means for coupling said prescribed potential to said output line in response to each of said first and second memory cell having stored therein a complementary bit pattern that matches the complementary bit pattern applied to said bit lines.

16. A content addressable memory device according to claim 15, wherein said prescribed potential coupling means includes means for preventing said prescribed potential from being coupled to said output line in response to said first memory cell having stored therein a first complementary bit pattern, and said second memory cell having stored therein a second complementary bit pattern, complementary to said first complementary bit pattern, irrespective of the complementary bit pattern applied to said bit lines.

17. A content addressable memory device according to claim 16, wherein said prescribed potential coupling means includes means for coupling said prescribed potential to said output line in response to said first memory cell having stored therein said second complementary bit pattern, and said second memory cell having stored therein said first complementary bit pattern, irrespective of the complementary bit pattern applied to said bit lines.

18. A content addressable memory device according to claim 12, wherein said first multibit memory cell comprises first and second bit storage elements for storing respective complementary bit values therein and first word enable means, coupled to said first word enable line, to each of said complementary bit lines and to said first and second storage elements, for controllably enabling the storage of complementary bit values that have been placed on said bit lines in said first and second storage elements, and said second multibit memory cell comprises third and fourth bit storage elements for storing respective complementary bit values therein, and second word enable means, coupled to said second word enable line, to each of said complementary bit lines, and to said third and fourth storage elements, for controllably enabling the storage of complementary bit values that have been placed on said bit lines in said third and fourth storage elements.

19. A content addressable memory device according to claim 18, wherein said prescribed potential coupling means comprises first controllable switch means, coupled between said prescribed potential and said output line and having a first control input coupled to one of said bit lines and a second control input coupled to one of said first and second storage elements, for controllably coupling said prescribed potential to said output line in accordance with the bit value of said one bit line and the bit value stored in said one of said first and second storage elements.

20. A content addressable memory device according to claim 19, wherein said prescribed potential coupling means comprises second controllable switch means, coupled between said prescribed potential and said output line and having a third control input coupled to the other of said bit lines and a fourth control input coupled to one of said third and fourth storage elements, for controllably coupling said prescribed potential to said output line in accordance with the bit value of said other bit line and the bit value stored in said one of said third and fourth storage elements.

21. A content addressable memory device according to claim 20, wherein the storage elements and the respective means of said memory device are comprised of MOS field effect transistors.

22. A digital memory comprising:
   a matrix of N columns of complementary bit line pairs and M rows of address line pairs; and
   an array of $N \times M$ memory devices, respective ones of which are coupled to respective ones of said N columns of complementary bit line pairs and respective ones of said M rows of address line pairs;
   each memory device including
   first and second complementary bit lines by way of which complementary bit values are applied from a column of complementary bit line pairs to said each memory device;
   first and second word enable lines coupled to a respective row of address line pairs;
   an output line;
   first and second multibit memory cells, respectively coupled to said first and second word enable lines and to each of said first and second complementary bit lines, for controllably storing complementary bits that have been placed on said first and second complementary bit lines, in accordance with first and second word enable signals applied to said first and second word enable lines, respectively; and
   means, coupled to said first and second memory cells, to each of said first and second complementary bit lines and to said output line, for controllably coupling a prescribed potential to said output line in accordance with the contents of said first and second memory cells and the complementary bits applied to said first and second complementary bit lines.

23. A digital memory according to claim 22, wherein said prescribed potential coupling means includes means for preventing said prescribed potential from being coupled to said output line in response to the each of said first and second memory cells having stored therein a complementary bit pattern that is opposite to the complementary bit pattern applied to said first and second complementary bit lines.

24. A digital memory according to claim 23, wherein said prescribed potential coupling means includes means for coupling said prescribed potential to said output line in response to neither of said first and second memory cell having stored therein a complementary bit pattern that matches the complementary bit pattern applied to said first and second complementary bit lines.

25. A digital memory according to claim 24, wherein said prescribed potential coupling means includes means for preventing said prescribed potential from being coupled to said output line in response to said first memory cell having stored therein a first complementary bit pattern, and said second memory cell having stored therein a second complementary bit pattern, complementary to said first complementary bit pattern, irrespective of the complementary bit pattern applied to said first and second complementary bit lines.

26. A digital memory according to claim 25, wherein said prescribed potential coupling means includes means for coupling said prescribed potential to said output line in response to said first memory cell having stored therein said second complementary bit pattern, and said second memory cell having stored therein said first complementary bit pattern, irrespective of the complementary bit pattern applied to said first and second complementary bit lines.

27. A digital memory according to claim 22, wherein said first multibit memory cell comprises first and second bit storage elements for storing respective complementary bit values therein and first word enable means, coupled to said first word enable line, to each of said first and second complementary bit lines and to said first and second storage elements, for controllably enabling the storage of complementary bit values, that have been placed on said first and second complementary bit lines, in said first and second storage elements, and said second multibit memory cell comprises third and fourth bit storage elements for storing respective complementary bit values therein, and second word enable means, coupled to said second word enable line, to each of said first and second complementary bit lines, and to said third and fourth storage elements, for controllably enabling the storage of complementary bit values that have been placed on said first and second complementary bit lines in said third and fourth storage elements.

28. A digital memory according to claim 27, wherein said prescribed potential coupling means comprises first controllable switch means, coupled between said prescribed potential and said output line and having a first control input coupled to one of said first and second complementary bit lines and a second control input coupled to one of said first and second storage elements, for controllably coupling said prescribed potential to said output line in accordance with the bit value of said one bit line and the bit value stored in said one of said first and second storage elements.

29. A digital memory according to claim 28, wherein said prescribed potential coupling means comprises second controllable switch means, coupled between said prescribed potential and said output line and having a third control input coupled to the other of said first and second complementary bit lines and a fourth control input coupled to one of said third and fourth storage elements, for controllably coupling said prescribed potential to said output line in accordance with the bit value of said other bit line and the bit value stored in said one of said third and fourth storage elements.

30. A digital memory according to claim 29, wherein the storage elements and the respective means of said memory device are comprised of MOS field effect transistors.

31. A digital memory according to claim 22, wherein said prescribed potential coupling includes means for preventing said prescribed potential from being coupled to said output line in response to the application of the same prescribed bit value to each of said bit lines, irrespective of the contents of said first and second memory cells.

32. A digital memory according to claim 22, wherein each of the prescribed potential coupling means for a respective row of address line pairs are coupled as a logical "AND" to the output line for that row, such that said prescribed potential is prevented from being coupled to the output line for that row unless each of the prescribed potential coupling means for that row prevents said prescribed potential from being applied to the output line for that row.

33. A method of controlling the operation of a content addressable memory device that comprises first and second complementary bit lines by way of which complementary bit values are applied to said memory device, first and second word enable lines, an output line, first and second multibit memory cells, respectively coupled to said first and second word enable lines and to each of said bit lines, for controllably storing complementary bits that have been placed on said bit lines in accordance with first and second word enable signals applied to said first and second enable lines, respectively, and means, coupled to said first and second memory cells, to each of said bit lines and to said output line, for controllably coupling a prescribed potential to said output line in accordance with the contents of said first and second memory cells and the complementary bits applied to said bit lines, said method of comprising the steps of:

(a) for a first data value to be stored in said memory device, writing a first set of complementary bit values in each of said first and second multibit memory cells;

(b) for a second data value to be stored in said memory device, writing a second set of complementary bit values in each of said first and second memory cells; and (c) interrogating said memory device by coupling one of said first and second sets of complementary bit values to said complementary bit lines, and monitoring the state of said output line.

34. A method according to claim 33, further including in the step of:

(d) for a 'don't care' state of said memory device, writing one of said first and second sets of complementary bit values into said first memory cell and the other of said first and second sets of complementary bit values into said second memory cell, whereby, regardless of the interrogation of said memory device in step (c), each of said third and fourth means decouples said prescribed potential from said output line.

35. A method according to claim 34, further including the step of:

(e) for an 'inhibit' state of said memory device, writing the other of said first and second sets of complementary bit values into said first memory cell and said one of said first and second sets of complementary bit values into said second memory cell, whereby, upon interrogation of said memory device in step (c), one of said third and fourth means couples said prescribed potential to said output line.

36. In a content addressable digital memory comprised of an array of memory devices coupled to columns of complementary data lines and rows of address lines and output lines, wherein an associative read operation, through which the contents of said memory are examined, is carried out by applying a digital code to said data lines and monitoring said output lines, the improvement wherein each memory device of said array includes means for selectively programming that memory device so that the memory row in which said memory device is located may be fully content addressable, partially content addressable, or non-content addressable.

37. The improvement according to claim 36, wherein said selectively programming means includes means for causing a logic state representative voltage to be applied to its associated output line in response to the contents of said memory device not matching the contents of its associated complementary data lines.

38. The improvement according to claim 36, wherein said selectively programming means includes means for causing said logic state representative voltage to be applied its associated output line in response to the contents of said memory device corresponding to a preselected code representative of an inhibit condition, regardless of the contents of its associated complementary data lines.

39. A method of operating a content addressable memory device that is coupled to first and second complementary data lines by way of which data is written into said memory device and through which said memory device is interrogated, first and second word enable lines for selectively addressing said memory in the course of storage of data in said memory device, and an output line, said content addressable memory device comprising a first memory cell having first and second storage elements for storing respective data values therein, first means, coupled to said complementary data lines, said first word enable line and said first and second storage elements, for controllably enabling the storage of data values, that have been placed on said data lines, in said first and second storage elements, a second memory cell having third and fourth storage elements for storing respective data values therein, second means, coupled to said complementary data lines, said second word enable line and said third and fourth storage elements, for controllably enabling the storage of data values, that have been placed on said data lines, in said third and fourth storage elements, respectively, third means, coupled to said output line, one of said data lines and one of said first and second storage elements, for controllably coupling a prescribed potential to said output line in accordance with the contents of said one of said first and second storage elements and the data value of said one of said data lines, and fourth means, coupled to said output line, the other of said data lines and one of said third and fourth storage elements, for controllably coupling said prescribed potential to said output line in accordance with the contents of said one of said third and fourth storage elements and the data value of the other of said data lines, said method comprising the steps of:

(a) enabling one of the first and second word enable lines of said first and second memory cells, on a selected basis, and coupling data values to said complementary data lines so as to cause data values to be written into the storage elements of selected memory cells; and (b) reading out the contents of a selected row of memory cells, corresponding to a row of plural ones of said first and second memory cells, by enabling a selected word enable line and thereby causing the contents of each of the memory cells of said selected row to be coupled to its respective complementary data lines.

40. A method of operating a content addressable digital memory having a matrix of N columns of complementary bit line pairs and M rows of address line pairs, and an array of NXM memory devices, respective ones of which are coupled to respective ones of said N columns of complementary bit line pairs and respective ones of said M rows of address line pairs each memory device including first and second complementary bit lines by way of which complementary bit values are applied from a column of complementary bit line pairs to said each memory device, first and second word enable lines coupled to a respective row of address line pairs, an output line, first and second multibit memory cells, respectively coupled to said first and second word enable lines and to each of said first and second complementary bit lines, for controllably storing complementary bits that have been placed on said first and second complementary bit lines, in accordance with first and second word enable signals applied to said first and second word enable lines, respectively, and means, coupled to said first and second memory cells, to each of said first and second complementary bit lines and to said output line, for controllably coupling a prescribed potential to said output line in accordance with the contents of said first and second memory cells and the complementary bits applied to said first and second complementary bit lines, said method comprising the steps of:

(a) enabling one of the first and second word enable lines of the first and second multibit memory cells of a selected one of the M rows of address line pairs, and coupling data values to said complementary bit line pairs, so as to cause data values to be written into the multibit memory cells of the selected row; and (b) reading out the contents of said selected row of multibit memory cells by enabling a selected word line and thereby causing the contents of each of the memory cells of said selected row to be coupled to its respective complementary bit line pair.

* * * * *